(12) United States Patent
Zellweger et al.

(10) Patent No.: US 7,417,596 B2
(45) Date of Patent: Aug. 26, 2008

(54) GROUND CONNECTION OF A PRINTED CIRCUIT BOARD PLACED IN A WRISTWATCH TYPE ELECTRONIC DEVICE

(75) Inventors: Emil Zellweger, Lommiswil (CH); Jean-Daniel Etienne, Les Geneveys-sur-Coffrane (CH); Yvan Ferri, Lausanne (CH)

(73) Assignee: Asulab S.A., Marin (CH)

( * ) Notice: Subject to any disclaimer, the term of this patent is extended or adjusted under 35 U.S.C. 154(b) by 12 days.

(21) Appl. No.: 10/554,916

(22) PCT Filed: Jun. 14, 2004

(86) PCT No.: PCT/EP2004/051108

§ 371 (c)(1),
(2), (4) Date: Oct. 31, 2005

(87) PCT Pub. No.: WO2004/114029

PCT Pub. Date: Dec. 29, 2004

(65) Prior Publication Data

US 2006/0227058 A1   Oct. 12, 2006

(30) Foreign Application Priority Data

Jun. 18, 2003  (EP) .................................. 03013793

(51) Int. Cl.
*H01Q 1/12* (2006.01)
*H01Q 1/48* (2006.01)
*H01Q 1/24* (2006.01)

(52) U.S. Cl. ........................ 343/718; 343/846; 343/848; 343/702

(58) Field of Classification Search ................. 343/718, 343/702, 846, 847, 848, 849
See application file for complete search history.

(56) References Cited

U.S. PATENT DOCUMENTS 4,673,936 A   6/1987   Kotoh (Continued)

FOREIGN PATENT DOCUMENTS

EP   1 134 837   9/2001

(Continued)

OTHER PUBLICATIONS

GPS Watch—Une montre à quartz analogique . . . (European Chronometry Congesss . . . Generva, Sep. 28-29, 2000).

(Continued)

*Primary Examiner*—Hoang V Nguyen
*Assistant Examiner*—Robert Karacsony
(74) *Attorney, Agent, or Firm*—Sughrue Mion, PLLC

(57) ABSTRACT

There is disclosed an electronic instrument worn on the wrist including a case (2) at least a part (4) of which is electrically conductive and in which are housed an electronic module (6) including a printed circuit board (60) and an electric power source (10) for powering the electronic module. The printed circuit board (60) has, at its periphery, a mechanical contact zone with the electrically conductive part (4) of the case (2), and includes a conductive path (65) extending at the periphery of the printed circuit board, over the mechanical contact zone, and establishing an electric contact with the electrically conductive part (4) of the case (2). The electronic instrument further provides an antenna (20) provided with an ground plane (22) where the conductive path (65) electrically connects this ground plane (22) to the electrically conductive path (4) of the case (2), in directions extending substantially in the extension of the ground plane of the antenna (20) in order to increase the reception sensitivity of the latter.

11 Claims, 4 Drawing Sheets

SECTION A-A

U.S. PATENT DOCUMENTS

| | | | |
|---|---|---|---|
| 5,244,395 A * | 9/1993 | DeSantis et al. | 439/65 |
| 5,646,634 A * | 7/1997 | Bokhari et al. | 343/700 MS |
| 6,134,188 A | 10/2000 | Ganter et al. | |
| 6,266,019 B1 | 7/2001 | Hickle et al. | |
| 6,531,988 B1 * | 3/2003 | Koyama | 343/718 |
| 2002/0022459 A1 | 2/2002 | Kobayashi | |

FOREIGN PATENT DOCUMENTS

| | | |
|---|---|---|
| EP | 1 274 150 | 1/2003 |
| GB | 2 313 239 | 11/1997 |

OTHER PUBLICATIONS

GPS Watch—An analogue watch including a very . . . (ION GPS 2000 Conference, Salt Lake City, UT, USA, Sep. 19-22, 2000).

JP 10197662 (abstract).

* cited by examiner

SECTION A-A

SECTION B-B

GROUND CONNECTION OF A PRINTED CIRCUIT BOARD PLACED IN A WRISTWATCH TYPE ELECTRONIC DEVICE

FIELD OF THE INVENTION

The present invention concerns generally the electric connection of an electronic module in a portable instrument. More specifically, the present invention concerns an electronic instrument worn on the wrist including a case at least one part of which is electrically conductive and in which are housed an electronic module including a printed circuit board and an electric power source for powering the electronic module. In particular, the invention relates to an electronic instrument of this type also including an antenna provided with an ground plane.

BACKGROUND OF THE INVENTION

Electronic instruments worn on the wrist taking a form similar to that of a wristwatch are already known. Specific examples of such electronic instruments answering the aforementioned definition are also known.

European Patent No. 1 274 150 A1 proposes, for example, a portable electronic instrument able to take the form of a wristwatch and a part of whose case can be made of an electrically conductive metal material, this electronic instrument also including an antenna for receiving satellite positioning signals. According to this solution, the electronic module does not lie directly in the electrically conductive part of the case, but inside an assembly made of plastic material, the electronic module being supplied with electric power by the electric power source in a conventional manner via conductive contact strips or flanges. It should also be noted that the antenna (a micro-strip—or patch antenna—including a radiating element separated from a ground plane by a dielectric) lies on an element forming a bezel fitted onto the case and made of a dielectric material.

The articles entitled ("GPS Watch—Une montre à quartz analogique équipée d'un récepteur GPS à très faible consommation" (European Chronometry Congress, CEC 2000, Session 7, Communication 19, Geneva, 28 and 29 Sep. 2000) and "GPS Watch—An analogue watch including a very low power GPS receiver" (ION GPS 2000 Conference, Salt Lake City, Utah, USA, Sep. 19-22, 2000) in the name of P.-A. Farine and consorts, Asulab S.A., also describe an electric instrument taking the form of a wristwatch including a case in which are housed an electric power source, an electronic module carrying in particular a micro-strip antenna and a satellite positioning receiver, as well as an analogue and digital display device. A part of the case, in this case a back cover-middle part, can also be made of an electrically conductive metal material, a non metal bezel being, however, fitted onto the top part of the instrument above the antenna. Like the solution disclosed in the aforementioned EP Patent No. 1 274 150 A1, the electronic module is powered by the electric power source via conductive contact strips or flanges. According to this solution, it should be noted that the microstrip antenna lies directly on the printed circuit board of the electronic module where its ground plane is made.

In order to complete this list of the state of the art, European Patent No. 1 134 837 A1, which discloses a portable electronic instrument including a so-called inverted L antenna or inverted F antenna because of its particular profile, should also be cited. The ground plane of this antenna is made on the top face of the printed circuit board of the electronic module. Insofar as the lateral and top parts of the case are made in one piece as illustrated in this document, the configuration of the instrument necessarily requires the use of a dielectric material to make the case in which the electronic module is housed. The electronic module is again powered by the electric power source by conductive contact strips or flanges. It should also be stressed that the electronic instrument has a back cover made of metallic material, which is electrically connected to a determined electric potential, in this case the positive potential of the electric power source. It is mentioned that this electric connection has the advantage of allowing the surface of the antenna ground plane to be increased, in particular via the body of the person wearing the instrument, which leads to increased sensitivity of the antenna.

In the aforementioned examples, it should thus be noted that the electronic module is conventionally powered by the electric power source via a set of conductive contact strips or flanges, electrically connecting the two electric poles of the power source to the sets of conductive supply paths typically made on the printed circuit board of the electronic module.

When one wishes to design an electronic instrument of the aforementioned type and fit it with a case at least part of which is electrically conductive, for example metal, it is known that it is also desirable to fix the electric potential of this conductive part rather than leave it floating. The electric potential of this electrically conductive part is thus often fixed by an electric connection to one of the poles of the electric power source, for example to the ground potential or the other supply potential. This electric connection is achieved either by directly connecting the part concerned to the corresponding pole of the power source, or again via conductive contact strips or flanges. By way of example, the European Patent No. 1 134 837 A1 mentions that the connection of the metal back cover to the positive pole of the electric power source is achieved via contact strips.

The use of conductive contact strips or flanges to ensure the electric connection of the electronic module and/or a part of the case to the electric power source often constitutes a constraint, in particular when the portable instrument is being assembled. It is an object of the present invention to propose a solution simplifying to a certain extent the manufacture of these electric connections as well as the operations for assembling the instrument.

Within the scope of the more specific embodiment wherein the instrument incorporates an antenna fitted with a ground plane, a solution is sought for increasing the sensitivity of the antenna by enlarging its ground plane via a simplified electric connection, the enlargement being located substantially in the plane containing the ground plane of the antenna. Owing to this latter feature, improvement in the sensitivity of the antenna is better in the case of the present invention than in the case of the prior art.

SUMMARY OF THE INVENTION

The present invention concerns a portable electronic instrument or device whose features are listed in the independent claim 1.

Thus, according to the invention, the printed circuit board has, at its periphery, a mechanical contact zone with the electrically conductive part of the case and includes a conductive path extending at the periphery of the printed circuit board, on the mechanical contact zone, in order to allow an electric contact to be established with the electrically conductive part of the case.

According to a preferred embodiment of the invention, the conductive path extending at the periphery of the printed circuit board electrically connects the antenna's ground plane to the electrically conductive part of the case. This connection ensures an enlargement of the antenna's ground plane and an increase in the antenna's reception sensitivity.

According to a particularly advantageous variant, a conductive strip made of compressible material (preferably a conductive elastomer) is inserted, on the mechanical contact zone, between the electrically conductive part of the case and the conductive path. This conductive strip is preferably compressed between the conductive path and a shoulder arranged on the electrically conductive part of the case. Moreover, the instrument can include a support element exerting pressure on several points of the periphery of the printed circuit board where the conductive strip is compressed, in order to encourage good mechanical stability of the assembly as well as a good electric contact between the conductive part of the case and the electronic module.

Other advantageous variants form the subject of the dependent claims.

BRIEF DESCRIPTION OF THE DRAWINGS

Other features and advantages of the present invention will appear more clearly upon reading the following detailed description of embodiments of the invention given solely by way of non-limiting examples and illustrated by the annexed drawings, in which.

DETAILED DESCRIPTION

Figure 1:
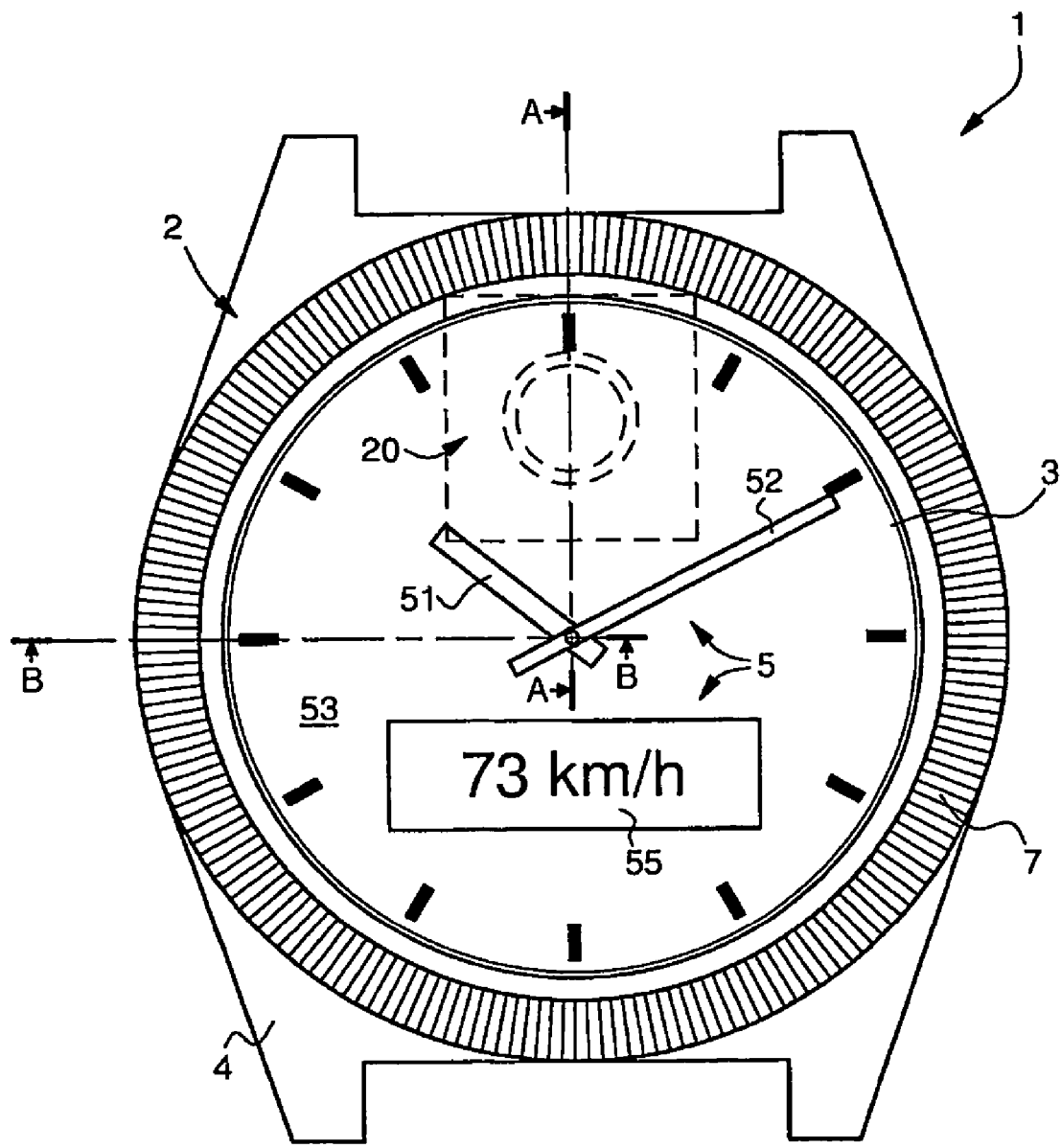
FIG. 1 shows an overall plan view of an electronic instrument worn on the wrist taking a similar form to that of a wristwatch and forming an embodiment of the invention.

FIG. 1 shows a plan view of an electronic instrument or device, designated as a whole by the reference numeral 1, according to a first embodiment of the invention. This device advantageously takes the form of a wristwatch and is fitted with an antenna 20 (shown in dotted lines in FIG. 1) electrically connected to an electronic module (reference 6 in FIGS. 2 and 3) housed inside electronic instrument 1. Within the scope of this embodiment, antenna 20 is intended to allow reception of radiofrequency signals transmitted by one or several remote transmission sources. More specifically, this antenna 20 is intended to allow reception of satellite positioning and navigation signals, such as the GPS signals originating from the American satellite positioning system NAVSTAR or other positioning signals originating from similar systems, such as the Russian GLONASS system or the future European satellite positioning and navigation system GALILEO.

Electronic instrument 1 has a general appearance similar to that of a conventional wristwatch and includes, in addition to antenna 20, a case 2, a wristband (not shown) attached to case 2, a glass 3 under which a display device 5 is arranged, enclosed in case 2, and control members (not shown). Display device 5 includes, in this case, an analogue display including two hands 51, 52 moving opposite a dial 53 (particularly allowing a conventional time display) completed by a digital display 55, for example a liquid crystal display. From the point of view of the display and user interface, this electronic instrument is comparable to that described in the two articles by P.-A. Farine and consorts mentioned in the description of the state of the art hereinbefore. In any case, the configuration shown in the Figures has to be considered purely illustrative and non-limiting.

Figure 2:
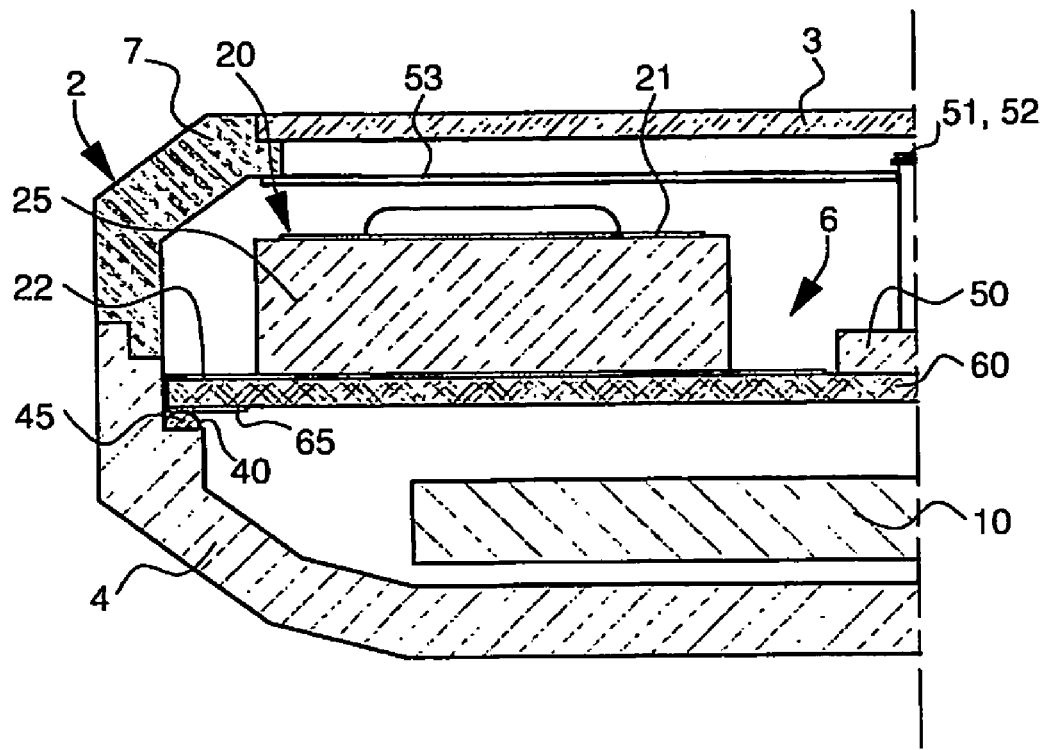
FIG. 2 is a partial cross-section of the electronic instrument of FIG. 1 along the line of cross-section A-A parallel to the 6 o'clock-12 o'clock axis of the instrument.

FIG. 2 shows a partial cross-section of the electronic instrument of FIG. 1 taken along the cross-sectional line A-A parallel to the 6 o'clock-12 o'clock axis and passing through the centre of instrument 1. Case 2, glass 3, dial 53, facing which hands 51, 52 rotate and antenna 20, arranged under dial 53, are shown again. The electronic instrument further includes, as illustrated, an electronic module 6 including a printed circuit board 60 (preferably a multi-layered board) on which are mounted the various electronic and electric components of the instrument (including a motor designated 50 with its axes for driving hands 51, 52) as well as an electric power source 10 powering particularly electronic module 6 and display device 5. This electric power source 10 can be formed of a conventional battery, a rechargeable accumulator or any other suitable electric power source.

As illustrated in FIG. 2, antenna 20 lies directly on the top face of printed circuit board 60 on the side of glass 3 and display device 5, under dial 53. Case 2 is formed in two parts, a first forming an external body or back-cover—middle part 4, and a second forming a bezel 7 which carries glass 3 and which is fitted onto external body 4. Because of the arrangement of antenna 20 inside case 2 in this example, bezel 7, dial 53 and hands 51, 52, which partly cover antenna 20, are made of a material that does not, so to speak, disturb the working of the antenna, such as a plastic material (hands 51, 52 can also be brought into angular positions where they no longer cover the antenna). External body 4 is made, by way of example, of an electrically conductive material, advantageously metal (for example steel or aluminium), or of a base material coated with an external electrically conductive layer.

In the illustration of FIG. 2, it can be seen that printed circuit board 60 has, at its periphery, a mechanical contact zone with the electrically conductive part of case 2, namely with external body 4 in this example. More specifically, external body 4 includes a shoulder 40 on which printed circuit board 60 rests via its periphery.

In the embodiment shown in the Figures, antenna 20 is a micro-strip antenna (or patch antenna) of essentially parallelepiped shape, including a radiating element 21 separated from an ground plane 22 by a dielectric 25, for example made of ceramic material. The volume of antenna 20 is typically of the order of approximately $13 \times 13 \times 4$ mm$^3$. Radiating element 21 is formed of an essentially rectangular conductor element resting on the top part of dielectric 25. This radiating element 21 is conventionally connected to the electronic circuit via a conductor (not shown) passing through dielectric 25 to be connected to a corresponding path on printed circuit board 60. Ground plane 22 of the antenna is formed of a conductive surface (for example a metallisation) affixed to the top face of printed circuit board 60. The surface area of antenna ground plane 22 is typically greater than that of radiating element 21.

It is typically sought to maximise the surface area of ground plane 22, the area of said ground plane 22 being however limited by the presence of the electric and electronic components arranged in proximity to antenna 20 on electronic module 6. In the present case, motor 50 driving hands 51, 52 is arranged in proximity to antenna 20. In practice, it is thus impossible to make a ground plane of a size as large as desired without compromising on the dimensions of electronic instrument 1 as a whole. Given these constraints, an intermediate layer of multi-layered printed circuit board 60 is preferably used for arranging therein an additional ground layer that is connected to the other layers as well as to ground plane 22 of antenna 20, for example through metallised holes.

Figure 3:
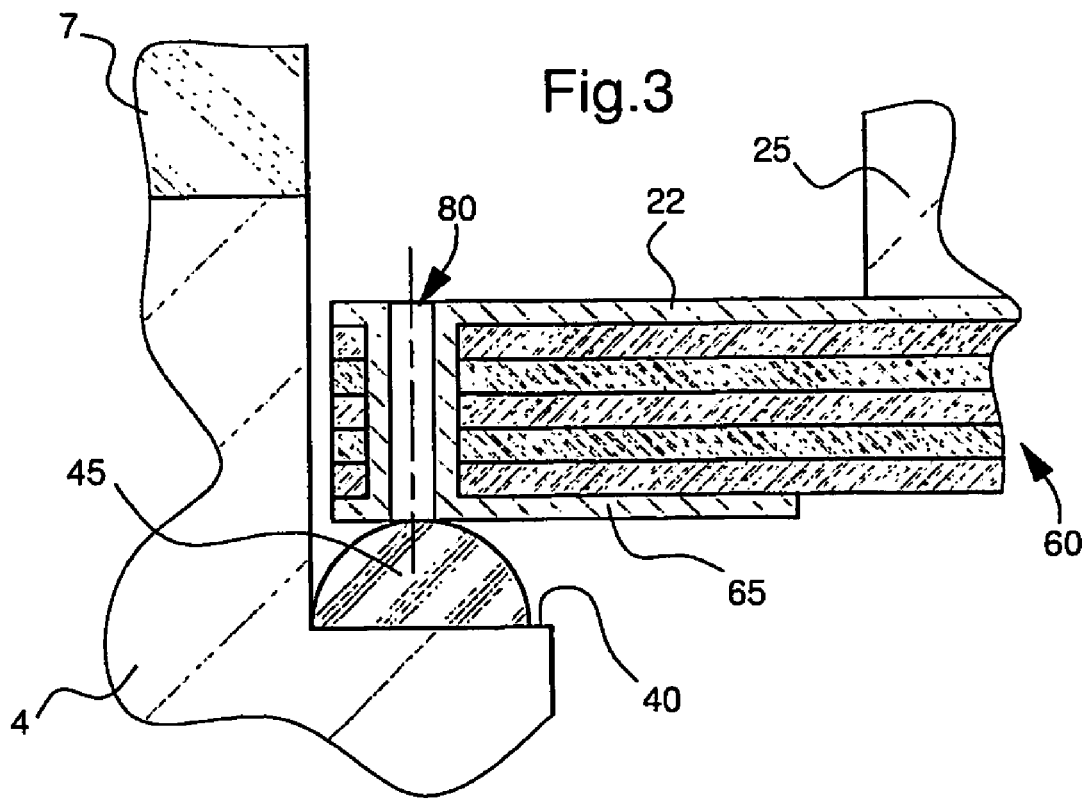
FIG. 3 is an enlarged view of the cross-section of FIG. 2 at the mechanical contact zone between the periphery of the printed circuit board and the case.

FIG. 3 is an enlarged view of the cross-section of FIG. 2 at the mechanical contact zone between the periphery of printed circuit board 60 and the electrically conductive part of case 2. In this view, a part of ground plane 22 of antenna 20 has been shown on the top face of printed circuit board 60 as well as a metallised hole 80 passing through the various layers (six in number here) of printed circuit board 60. It will be mentioned that a multitude of metallised holes is thus achieved on printed circuit board 60, not only to assure connections to ground, but also to assure electric connections between the electric and electronic components and the various paths of electronic module 6, which are arranged in the intermediate layers of printed circuit board 60. It should be noted that the size of metallised hole 80 and the thickness of the intermediate layers of printed circuit board 60 or the conductive layers are not shown to scale.

As illustrated in FIG. 3, and added to FIG. 2, a conductive path designated 65 is arranged on the bottom face of printed circuit board 60 and is electrically connected to ground plane 22 of antenna 20 via metallised holes 80 (or others distributed over electronic module 6). This conductive path 65 is arranged on the periphery of printed circuit board 60 and is particularly localised in the mechanical contact zone between printed circuit board 60 and shoulder 40 arranged on external body 4 of the case. This conductive path 65 extends preferably over essentially the entire periphery of printed circuit board 60, although it would be possible to envisage interrupting this conductive path 65 at one or several points of the periphery. Arranging path 65 over practically the entire periphery of the printed circuit board has the advantage of improving the quality of the electric contact with the electrically conductive part of case 2. Moreover, this solution contributes to improving the shielding of the components located, in this example, on the bottom face of electronic module 6 (for the sake of simplification, these components have not been shown in the Figures).

Alternatively, as regards the structure of case 2, external body 4 could be not entirely made of an electrically conductive material. In fact plastic materials could be used for the moulding then at least the contact zone could be coated with a conductive paint so as to establish an electric connection between external body 4 and conductive path 65 carried by printed circuit board 60. Other appropriate structures could also be provided to assure the electrical connection function without departing from the scope of the present invention like, for example, an embodiment of the external body in two parts, namely a first part, substantially corresponding to a back cover, made of plastic material and a second part, substantially corresponding to a middle part, made of an electrically conductive material.

Generally, it is very convenient to arrange at least conductive path 65 in the region of printed circuit board 60 located substantially in the direct extension of the antenna's ground plane to improve the sensitivity of the antenna.

Preferably, as illustrated, an electrically conductive strip 45 made of a compressible material is inserted on the mechanical contact zone between the electrically conductive part of case 2 and conductive path 65. One could a priori envisage omitting this conductive path 45. The use of conductive strip 45 is however preferable in order to assure that the electric contact between path 65 and conductive external body 4 is of high quality and properly maintained. Conductive strip 45 can advantageously be made of a conductive elastomer shaped into a joint inserted between shoulder 40 and printed circuit board 60 or alternatively directly deposited on shoulder 40 before electronic module 6 is assembled.

Figure 4:
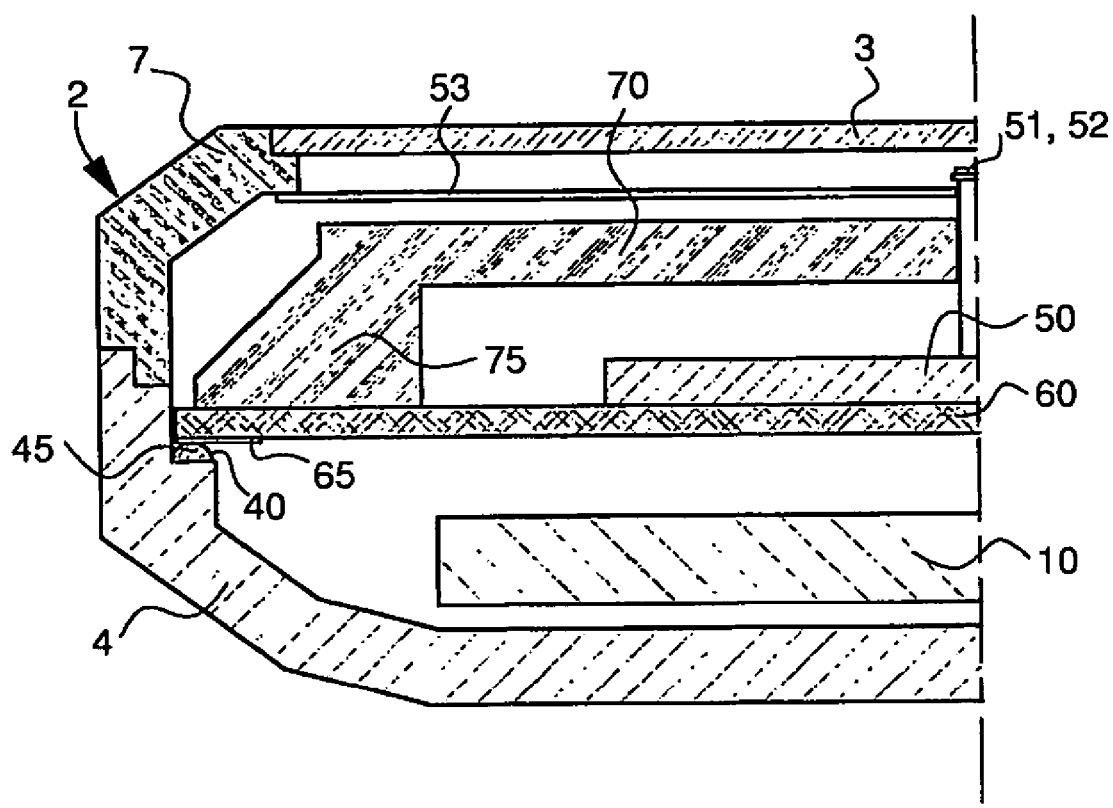
FIG. 4 is another partial cross-section of the electronic instrument of FIG. 1 along the line of cross-section B-B parallel to the 9 o'clock-3 o'clock axis of the instrument.

In order to further improve the quality and strength of the mechanical and electric contact between electronic module 6 and the conductive part of case 2, it is also preferable to provide a support element exerting a pressure at several points of the periphery of printed circuit board 60 where electrically conductive strip 45 is compressed. As apparent from FIG. 4, the embodiment illustrated includes such a support element designated by the reference numeral 70, which is placed on the top face of printed circuit board 60 under bezel 7. This support element 70 includes a base 75, which abuts on the periphery of printed circuit board 60 where conductive strip 45 is compressed. This base 75 allows the periphery of printed circuit board 60, which can typically have a relatively small thickness and thus a certain elasticity, to be rigidified.

Support element 70 can be simply inserted between electronic module 6 and bezel 7 and thus be applied against electronic module 6 or be directly secured to back cover—middle part 4, for example by being screwed in. Alternatively, it will also be understood that bezel 7 could be modified to act directly on the periphery of printed circuit board 60.

Figure 5:
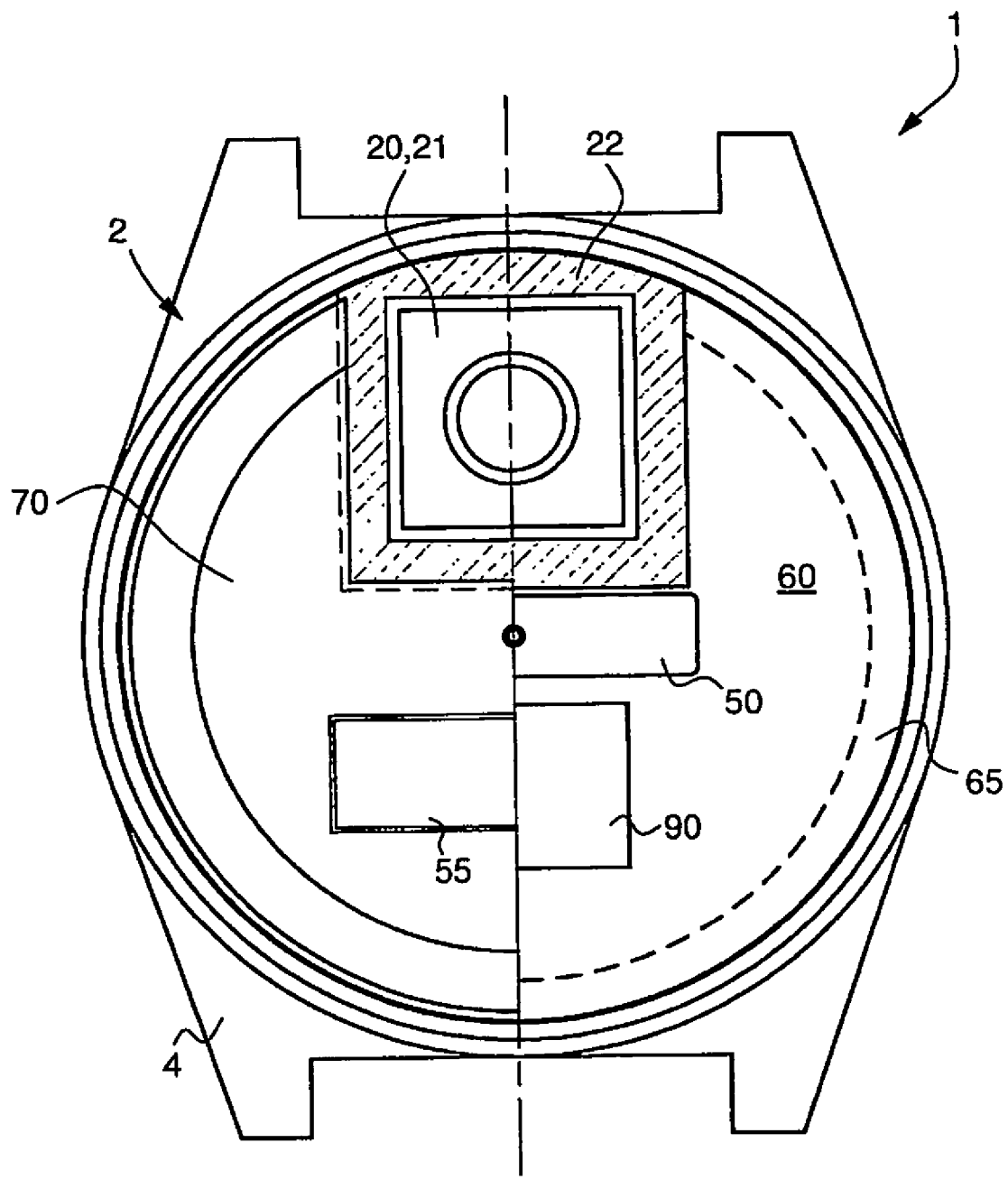
FIG. 5 is a plan view of the electronic instrument in which the top part of the instrument and a part of the display device have not been shown.

FIG. 5 is a similar plan view to FIG. 1 in which the top part of the instrument (bezel 7 and glass 3) as well as a part of display device 5 (hands 51, 52 and dial 53) has not been shown. Support element 70 and digital display 55 are partially illustrated in the left part of the Figure. In the right part of the Figure, motor 50 driving the hands can still be partially seen as well as a circuit 90 (for example a clockwork microcontroller) that is also mounted on the top part of printed circuit board 60 of electronic module 6. Antenna 20 is illustrated as well as its ground plane 22, whose larger surface area is indicated by the hatching. It will be noted that a recess is arranged in support element 70 to receive antenna 20.

Within the scope of the aforementioned example, it will thus have been understood that ground plane 22 of micro-strip antenna 20 is electrically connected via conductive path 65 directly to the electrically conductive part of case 2, namely back cover—middle part 4. This ensures an enlargement of the antenna's ground plane, in directions extending substantially in the extension of the antenna's ground plane, and thus an improvement in the detection sensitivity of the antenna. Tests carried out have demonstrated that a significant gain in sensitivity can be attained due to this connection to the electrically conductive part of the case.

In the foregoing, a solution has been presented wherein the antenna rests directly on the printed circuit board. It will be understood that this is not necessarily the case and that the antenna could be arranged according to other configurations. By way of alternative, it would be possible to envisage arranging the antenna and its ground plane on bezel 7, as is proposed in European Patent No. 1 274 150 A1, the antenna then being covered by a protective element. In this configuration, it will be noted that the ground plane of the antenna could advantageously be formed of a stamped metal plate possessing legs forming a ground conductor and which connect the ground plane to the electronic module. An improvement in the reception sensitivity of the antenna can also be expected in this configuration, insofar as one ensures, as previously, an electrical connection of the ground plane of the antenna to the electrically conductive part of the case via a conductive path arranged at the periphery of electronic module 6. It will be recalled that such a connection is not provided in EP Patent No 1 274 150 A1.

Of course, the improvement in sensitivity obtained in this case is less than that obtained with the embodiment shown because of the greater shift existing between the ground plane of the antenna and conductive path 65.

As already mentioned in the preamble, a determined electric potential (ground potential or other) is typically applied to the electrically conductive parts of the case of such an electronic instrument worn on the wrist. The present invention ensures the application of such a determined electric potential to the electrically conductive part of the case via the conductive path arranged at the periphery of the printed circuit board, this conductive path being itself at desired electric potential. In such case, the electric potential of the electrically conductive part of the case is brought and established via the electronic module.

According to an alternative, it is possible to envisage using directly the electrically conductive part of the case to bring a determined electric potential to the electronic module. In particular, one of the poles of the electric power source could be directly connected, or also via a fuse, to the electrically conductive part of the case and be brought via the latter to the electronic module via the conductive path arranged at the periphery of the printed circuit board.

It will be understood generally that various modifications and/or improvements evident to those skilled in the art can be made to the embodiments described in the present description without departing from the scope of the invention defined by the annexed claims.

Specifically concerning the question of the antenna, it will also be noted that the invention is applicable to any type of antenna provided with a ground plane, including Planar Inverted-F or L Antennas (PIFA).

The invention claimed is:

1. A wristwatch including a case at least one part of which is electrically conductive and in which are housed an electronic module including a printed circuit board and an electric power source for powering said electronic module, said wristwatch further including an antenna provided with a ground plane, said printed circuit board having, at its periphery, a mechanical contact zone bearing on said electrically conductive part of the case, wherein the antenna and the ground plane are arranged on a top face of said printed circuit board, said top face being arranged on the side of a display device of the wristwatch, wherein said printed circuit board includes a top surface and a bottom surface, a conductive track electrically connected to said ground plane, said conductive track extending at the periphery of said printed circuit board and at least over said bottom surface of said printed circuit board, over said mechanical contact zone, in such a way as to establish an electric contact between said conductive track and said electrically conductive part of the case, so as to enlarge the ground plane of said antenna in directions extending substantially in the extension of said ground plane, the enlargement being located substantially in the plane containing the ground plane of the antenna, and wherein said electrically conductive part has a portion thereof extending at least substantially to the level of the bottom surface of the printed circuit board.

2. The wristwatch according to claim 1, wherein said antenna is a micro-strip antenna including a radiating element arranged substantially parallel to said ground plane.

3. The wristwatch according to claim 1, wherein said wristwatch includes an electrically conductive strip made of compressible material that is inserted, on said mechanical contact zone, between said electrically conductive part of the case and said conductive track.

4. The wristwatch according to claim 3, wherein said electrically conductive strip is compressed between said conductive track and a shoulder arranged on the electrically conductive part of the case.

5. The wristwatch according to claim 4, wherein said wristwatch further includes a support element exerting a pressure at several points of the periphery of said printed circuit board where said electrically conductive strip is compressed.

6. The wristwatch according to claim 3, wherein said electrically conductive strip is a conductive elastomer.

7. The wristwatch according to claim 1, wherein said conductive track is arranged on a first face of the printed circuit board and is electrically connected to other conductive tracks of the electronic module via metallised holes.

8. The wristwatch according to claim 1, wherein said electrically conductive part of the case is electrically connected to a pole of determined electric potential of the electric power source, said electrically conductive part of the case being used to bring said determined electric potential to said electronic module via said conductive track.

9. The wristwatch according to claim 1, wherein said electrically conductive part of the case is brought to a determined electric potential via said conductive track.

10. The wristwatch according to claim 1, wherein said conductive track extends over substantially the entire periphery of the printed circuit board.

11. The wristwatch according to claim 1, wherein said conductive track extends over at least a part of the periphery of the printed circuit board located in proximity to said ground plane.

\* \* \* \* \*